United States Patent [19]

Hilz et al.

[11] Patent Number: 4,841,241
[45] Date of Patent: Jun. 20, 1989

[54] TESTING DEVICE FOR BOTH-SIDED CONTACTING OF COMPONENT-EQUIPPED PRINTED CIRCUIT BOARDS

[75] Inventors: Wolfgang Hilz, Munich; Rudolf Schuster, Heimstetten; Hans Schauflinger, Munich, all of Fed. Rep. of Germany

[73] Assignee: Siemens Aktiengesellschaft, Berlin and Munich, Fed. Rep. of Germany

[21] Appl. No.: 75,994

[22] Filed: Jul. 21, 1987

[30] Foreign Application Priority Data

Aug. 7, 1986 [DE] Fed. Rep. of Germany ....... 3626693

[51] Int. Cl.$^4$ .................. G01R 1/04; G01R 1/073
[52] U.S. Cl. .................. 324/158 F; 324/73 PC; 324/158 P
[58] Field of Search ........... 324/73 PC, 158 P, 158 F

[56] References Cited

U.S. PATENT DOCUMENTS

| 3,970,934 | 7/1976 | Aksu | 324/158 F |
| 4,335,350 | 6/1982 | Chen . | |
| 4,626,776 | 12/1986 | Wilkinson | 324/158 P |
| 4,626,779 | 12/1986 | Boyle | 324/158 F |
| 4,694,245 | 9/1987 | Frommes | 324/73 PC |
| 4,733,172 | 3/1988 | Smolley | 324/158 F |

FOREIGN PATENT DOCUMENTS 1754669 10/1966 Japan .................. 324/158 P

Primary Examiner—Reinhard J. Eisenzopf
Assistant Examiner—W. Burns
Attorney, Agent, or Firm—Hill, Van Santen, Steadman & Simpson

[57] ABSTRACT

A lower needle adapter has lower, resilient contact needles and an upper needle adapter has upper, resilient contact needles which are provided for contacting of both sides of component equipped printed circuit boards. Defined contacting conditions having correspondingly high contact reliabilities are achieved in that the printed circuit boards are pressed against opposite pressure rams arranged in non-yielding fashion, being pressed thereagainst by resiliently fashioned pressure rams. When resilient, upper pressure rams are used to press the printed circuit boards against lower pressure rams which are adjustable in height in two stages, then a both-sided, two-stage contacting can be realized in a simple way with corresponding, additional, shorter lower and upper contact needles.

20 Claims, 2 Drawing Sheets

TESTING DEVICE FOR BOTH-SIDED CONTACTING OF COMPONENT-EQUIPPED PRINTED CIRCUIT BOARDS

BACKGROUND OF THE INVENTION

The invention is directed to a testing device for component equipped printed circuit boards having a lower needle adapter carrying spring-seated, lower contact needles arranged test-specimen-associated for contacting the under side of the printed circuit board and comprising a plurality of upper pressure rams arranged test-specimen-associated.

Needle adapters having contact pins arranged test-specimen-associated are used for the electrical testing of component equipped printed circuit boards, such as logic cards. A distinction is thereby made between a circuit test or a function and sub-function test. During the test, the equipped printed circuit board has its solder side pressed against spring-seated contact needles arranged in the needle adapter. When both a circuit test, as well as, a function or sub-function test are then to be carried out in the same testing device, a two-stage contacting device having contact needles of different lengths is provided. In the first stage of the contacting, only the long contact needles come into engagement during the function or, respectively, sub-function test, whereas the short contact needles are added in the second stage of the contacting during the circuit test.

A simultaneous contacting at the components side of the printed circuit board is not provided in the known needle adapters. In the course of the increasingly prevalent SMT technology, however, this demand for a two-stage contacting is required more and more frequently. Further, the plug connectors can frequently be contacted only from above insofar as one wishes to forego the involved, lateral contacting of the plugs in the function test.

The pressing of the equipped printed circuit boards required for contacting can be mechanically undertaken via correspondingly distributed pressure rams. For example, vacuum adapters are frequently utilized. The equipped printed circuit board is manually placed on a sealing rubber therein and pressed thereagainst by producing a vacuum. Contrasting with the advantage of an improved accessibility to the components side given such vacuum adapters are a number of disadvantages at the same time. Since an optimum metering of the vacuum is not possible, inadmissibly high bending of the printed circuit boards can occur due to the high surface pressure and cannot be reliably avoided. Further, the sealing represents a considerable problem, so that a reliable contacting can frequently only be guaranteed by using additional pressing at specific locations or by other, additional, manual operations. Further, the spectrum of printed circuit boards suitable for testing in vacuum adapters is limited since, for example, open plate-throughs and passages should not be present. In view of the automation of the final testing of equipped printed circuit boards, the problems recited above are even more pronounced. In particular, the contacting reliability would be further reduced by additionally occurring sealing problems given an automatic changing of the printed circuit boards.

SUMMARY OF THE INVENTION

The object of the present invention is to create a testing device for both-sided contacting of component equipped printed circuit boards wherein an unambiguously defined and reliable fixing of the printed circuit board and a high contacting reliability are guaranteed in every contacting stage.

In a testing device of the species initially cited, this object is inventively achieved in that an upper needle adapter is additionally provided and carries spring-seated, upper contact needles arranged test-specimen-associated; and in that an additional plurality of lower pressure rams arranged test-specimen-associated are provided. The printed circuit boards can be pressed against non resiliently arranged pressure rams by resiliently fashioned pressure rams lying opposite the nonresilient pressure rams.

The testing device of the present invention thus provides contacting both sides of component equipped printed circuit boards which is enabled by mechanical clamping of the printed circuit boards between upper and lower pressure rams.

A critical requirement for high contacting reliability is thereby the combination of rigidly arranged and resiliently fashioned pressure rams. In the contacting of a first printed circuit board side, the resilient pressure rams press the printed circuit board against the contact needles lying opposite and also against the rigidly arranged pressure rams lying opposite, whereby the latter act like a stop and guarantee an unambiguously defined contacting condition. Subsequently, the resilient pressure rams yield farther until a contacting with unambiguously defined contacting condition is also achieved at the other side of the printed circuit board.

It has proven especially beneficial in practice for the execution of the testing for the upper pressure rams to be resiliently fashioned and the lower pressure rams to be nonresiliently arranged.

It is also expedient in view of the simplest possible realization of the testing device for the lower needle adapter to be stationarily arranged and the upper needle adapter to be arranged adjustable in vertical direction. In this case, the resilient, upper pressure rams can then be firmly arranged in the upper needle adapter. The upper needle adapter and the upper pressure rams can thus be moved via a shared drive.

It is provided in an especially preferred embodiment of the present invention that the lower needle adapter carries first and second, spring-seated lower contact needles arranged test-specimen-associated and differing in length for two-stage contacting of the undersides of the printed circuit boards; and that the lower pressure rams are adjustable in two stages in a vertical direction. This two-stage adjustability thereby enables a two-stage contacting of the underside with unambiguously defined contacting conditions.

The lower pressure rams are preferably guided in the lower needle adapter and can be actuated by a shared pressure plate. Given a test-specimen-associated replacement of the lower needle adapter comprising the lower pressure rams, the pressure plate and the drive thereof can then always remain in the testing device.

In order to be able to realize a two-stage contacting of both sides of the equipped printed circuit boards, it is also possible that the upper needle adapter can carry third and fourth, spring-seated, upper contact needles arranged test-specimen-associated and differing in length for two-stage contacting of the upper sides of the printed circuit boards.

A precise and especially simple positioning of the printed circuit boards is achieved in that at least two centering pins are arranged in the upper needle adapter.

BRIEF DESCRIPTION OF THE DRAWINGS

The features of the present invention which are believed to be novel, are set forth with particularly in the appended claims. The invention, together with further objects and advantages, may best be understood by reference to the following description taken in conjunction with the accompanying drawings, in the several Figures in which like reference numerals identify like elements, and in which:

BRIEF DESCRIPTION OF THE PREFERRED EMBODIMENT

Figure 1:
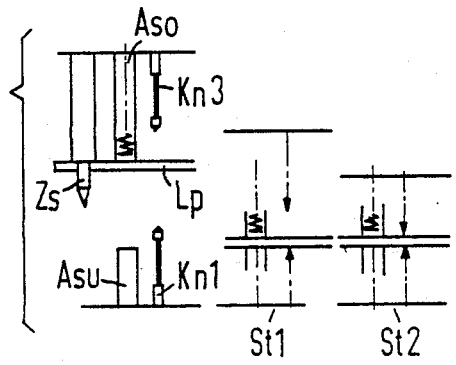
FIG. 1 is a schematic drawing depicting the contacting principal of a single-stage contacting of both sides of component equipped printed circuit boards.

FIG. 1 shows the sequence of a single-stage contacting of both sides of a printed circuit board Lp. Shown at the left-hand side of FIG. 1 in a greatly simplified, schematic illustration are a lower, stationarily arranged pressure ram Asu, a lower contact needle Kn1, a centering pin Zs, an upper, resiliently fashioned pressure ram Aso and an upper contact needle Kn3. A position in the initial stage of the contacting stroke is thereby shown in which the centering pin Zs has penetrated into the allocated centering bore of the printed circuit board Lp and the spring-seated, upper pressure ram Aso has also already pressed against the printed circuit board Lp. To the right of this illustration, the contact needles (now only indicated by arrows) show the two, successive contacting stages St1 and St2.

The contacting of the underside of the printed circuit board Lp by the lower contact needle Kn1 ensues in the first contacting stage St1. Here, the lower pressure ram Asu acts like a stop which limits the downward stroke of the printed circuit board Lp. The printed circuit board Lp is thereby firmly clamped between the lower pressure ram Asu and the upper pressure ram Aso, i.e. the contacting condition of the contacting stage St1 is clearly defined.

In the second contacting stage St2, the upper pressure rams Aso have resiliently yielded to such a degree that a reliable contacting of the upper side of the printed circuit board Lp by the upper contact needles Kn3 is also established.

Figure 2:
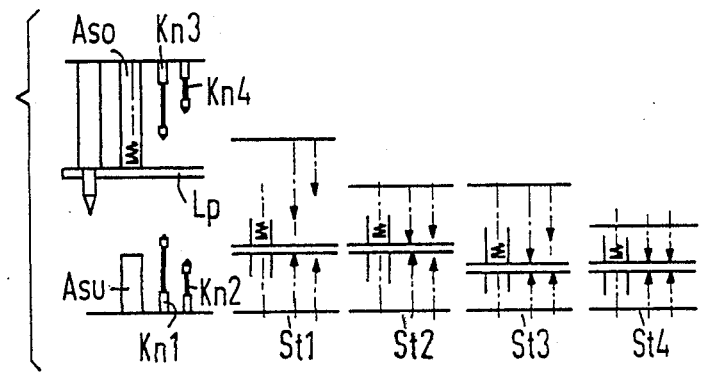
FIG. 2 is a schematic drawing depicting the contacting principal of a two-stage contacting of both sides of component equipped printed circuit boards.

FIG. 2 shows the sequence of a two-stage contacting of both sides of a printed circuit board Lp. The left-hand side of FIG. 2 shows the parts already shown in FIG. 1 and shows a shorter, second lower contact needle Kn2 arranged in addition to and next to the first, lower contact needle Kn1. Also a likewise shorter, upper fourth contact needle Kn4 is arranged in addition to and next to the upper, third contact needle Kn3. To the right, of this illustration, the contact needle (now only indicated by arrows) show the four successive contacting stages St1, St2, St3 and St4.

The first two contacting stages St1 and St2 need not be discussed in greater detail since they correspond to the contacting steps St1 and St2 already set forth with FIG. 1.

In the third contacting stage St3, the lower pressure ram Asu assumes a lower position in comparison to the contacting stages St1 and St2. A reliable contacting of the under side of the printed circuit board by the second contact needles Kn2 is now guaranteed by this lower position of the lower pressure ram Asu.

Finally, in the fourth contacting stage St4, a contacting of the upper side of the printed circuit board by the fourth contact needles Kn4 has occurred due to further, resilient yielding of the upper pressure ram Aso.

It may be seen that a firm clamping of the printed circuit board Lp between the lower pressure rams Asu and the upper pressure rams Aso in all contacting stages St1 through St4 respectively guarantees clearly defined contacting conditions. It may also be seen that some variations are possible for sequence of the contactings.

Figure 3:
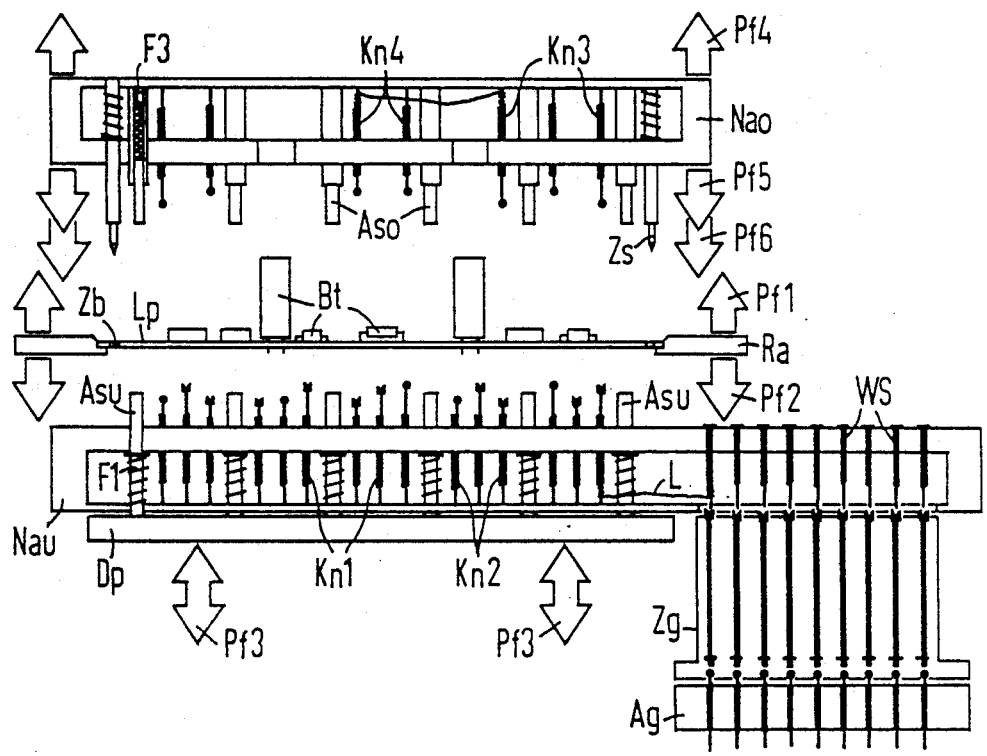
FIG. 3 is a greatly simplified, schematic illustration of a testing device suitable for the realization of the contacting principal shown in FIG. 2.

FIG. 3 shows a testing device for a two-stage contacting of both sides of component equipped printed circuit boards in a greatly simplified, schematic illustration. The contacting principle disclosed in FIG. 2 can thus be realized with the testing device shown in FIG. 3.

According to FIG. 3, the printed circuit board Lp to be tested is equipped with components Bt and is placed in an outer frame referenced Ra. Arrows Pf1 and Pf2 indicate that the frame Ra is upwardly and downwardly moveable in a vertical direction, whereby this mobility of the frame Ra and of the printed circuit board Lp arranged therein can, for example, be realized by a resilient suspension of the frame Ra.

A stationarily arranged, lower needle adapter Nau is situated under the printed circuit board Lp, this lower needle adapter Nau carries first, spring-seated contact needles Kn1 and somewhat shorter, second, spring-seated contact needles Kn2. It is indicated at one location that the contact needles Kn1 and Kn2 are connected via lines L to allocated spines WS. The spines WS are located outside of the contacting region in the lower needle adapter Nau and are in turn connected via an intermediate element Zg comprising resilient needles (not referenced in detail), which are in turn connected to needles (likewise not referenced in greater detail) of a connection member Ag. This connection on member Ag is part of the actual automatic testing unit which, for example can be the "Series 700" of Factron-Schlumberger Co. Albert Schweitzer Strasse 66, D-8000 Munich 83.

Lower pressure rams referenced Asu are further guided in the lower needle adapter Nau, these lower pressure rams being held moveable in vertical direction in the needle adapter Nau via springs F1. The lower pressure rams Asu are thus not resiliently fashioned but are adjustable in two stages in the vertical direction via a shared, lower pressure plate Dp. This two-stage adjustability indicated by double arrows Pf3 can, for example, be realized by a pneumatically or hydraulically actuatable adjustment cylinder arranged under the pressure plate Dp.

An upper needle adapter Nao arranged adjustable in the vertical direction is situated above the printed circuit board Lp. This upper needle adapter Nao carries third, spring-seated contact needles Kn3 and somewhat shorter, fourth, spring-seated contact needles Kn4. The further wiring (not shown in detail) of the contact needles Kn3 and Kn4 comprises transfer contacts to the lower needle adapter Nau, so that the upper testing contacts which are usually few in number are likewise connected to the automatic testing unit via the interface of the intermediate element Zg.

Upper pressure rams referenced Aso are thus rigidly arranged in the upper needle adapter Nao. These upper pressure rams Aso are resiliently fashioned telescope-like, whereby this resilient design is indicated by corresponding spring F3 at one location. Two centering pins Zs likewise arranged in the upper needle adapter Nao have the job of penetrating into allocated centering bores of the printed circuit board Lp and thus precisely positioning the printed circuit board Lp.

The vertical adjustability of the upper needle adapter Nao is indicated by arrows Pf4, Pf5 and Pf6, whereby the two downwardly directed arrows Pf5 and Pf6 are intended to symbolize the two-stage nature of the contacting. The vertical adjustment can be realized, for example, in that the upper needle adapter Nao is guided in a solid four-column frame and, dependent on the adapter size, is driven by a DC motor, being driven by one through four spindles synchronized with toothed belts. The described drive of the pressing mechanism is thereby executed as a programmable positioning shaft.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

We claim:

1. A testing device for equipped printed circuit boards having a lower needle adapter which carries resilient, lower contact needles arranged test-specimen-associated for contacting an underside of the printed circuit board, and having a plurality of upper pressure rams arranged test-specimen-associated, for contacting an upper side of the printed circuit board comprising an additional upper needle adapter carrying resilient upper contact needles arranged test-specimen-associated; and a plurality of additional lower pressure rams arranged test-specimen-associated, for contacting the underside of the printed circuit board whereby the printed circuit boards can be pressed against non-resiliently arranged pressure rams lying opposite, being pressable thereagainst with resiliently fashioned pressure rams, wherein one of said upper pressure rams and said lower pressure rams is resilient and the other is non-resilient.

2. The testing device according to claim 1, wherein said upper pressure rams are resiliently fashioned; and wherein said lower pressure rams are arranged in nonyielding fashion.

3. The testing device according to claim 1, wherein said lower needle adapter is stationarily arranged; and wherein said upper needle adapter is adjustable relative to said lower needle adapter.

4. The testing device according to claim 2, wherein said upper, resilient pressure rams are firmly arranged in said upper needle adapter.

5. The testing device according to claim 1, wherein said lower needle adapter carries first and second resilient, lower contact needles arranged test-specimen-associated, said first and second contact needles having different lengths for two-stage contacting of the undersides of the printed circuit boards; and wherein said lower pressure rams are adjustable in two stages in a vertical direction.

6. The testing device according to claim 5, wherein said lower pressure rams are guided in said lower needle adapter and are actuatable via a lower, shared pressure plate.

7. The testing device according to claim 1, wherein said upper needle adapter carries third and fourth resilient, upper contact needles arranged test-specimen-specific and said third and fourth contact needles having different lengths for two-stage contacting of the upper sides of the printed circuit boards.

8. The testing device according to claim 1, wherein said testing device further comprises at least two centering pins leading in comparison to the upper pressure rams and arranged in the upper needle adapter for positioning the printed circuit boards.

9. A testing device for component equipped printed circuit boards having an underside and an upperside, said testing device having a lower needle adapter carrying resilient lower contact needles arranged test-specimen-associated for contacting the underside of the printed circuit baord and also having a plurality of upper pressure rams arranged test-specimen-associated for engaging the upperside of the printed circuit board, comprising;
   upper needle adapter carrying resilient upper contact needles arranged test-specimen-associated for contacting the upperside of the printed circuit board;
   plurality of lower pressure rams arranged test-specimen-associated for engaging the underside of the printed circuit board; and
   wherein the printed circuit board is pressed against non-resilient pressure rams on one side of the printed circuit board by resilient pressure rams on the other side of the printed circuit board aligned oppositely to said non-resilient pressure rams, and wherein one of the plurality of said upper pressure rams and the plurality of said lower pressure rams is resilient and the other is non-resilient.

10. The testing device according to claim 9, wherein said upper pressure rams are resilient and said lower pressure rams are non-resilient.

11. The testing device according to claim 9, wherein said lower needle adapter is stationarily arranged; and wherein said upper needle adapter is arranged adjustable in vertical direction.

12. The testing device according to claim 11, wherein said upper, resilient pressure rams are firmly arranged in said upper needle adapter.

13. The testing device according to claim 9, wherein said lower needle adapter carries first and second resilient, lower contact needles arranged test-specimen-associated, said first and second contact needles having different lengths for two-stage contacting of the undersides of the printed circuit boards; and wherein said lower pressure rams are adjustable in two stages in a vertical direction.

14. The testing device according to claim 13, wherein said lower pressure rams are guided in said lower needle adapter and are actuatable via a lower, shared pressure plate.

15. The testing device according to claim 9, wherein said upper needle adapter carries third and fourth resilient, upper contact needles arranged test-specimen-specific and said third and fourth contact needles having different lengths for two-stage contacting of the upper sides of the printed circuit boards.

16. The testing device according to claim 9, wherein said testing device further comprises at least two centering pins leading in comparison to the upper pressure rams and arranged in the upper needle adapter for positioning the printed circuit boards.

17. A testing device for component equipped printed circuit boards having an underside and an upperside, comprising:
- a stationary lower needle adapter carrying a plurality of lower pressure rams and carrying resilient lower contact needles arranged test-specimen-associated for contacting the underside of the printed circuit board;
- a plurality of resilient upper pressure rams arranged test-specimen-associated for engaging the upperside of the printed circuit boards;
- a vertically adjustable, relative to said lower needle adapter, upper needle adapter carrying said upper pressure rams, and carrying resilient upper contact needles arranged test-specimen-associated for contacting the upperside of the printed circuit board; and
- said plurality of non-resilient lower pressure rams arranged test-specimen-associated for engaging the underside of the printed circuit board.

18. The testing device according to claim 17, wherein said lower needle adapter carries at least first and second resilient, lower contact needles arranged test-specimen-associated, said first and second contact needles having different lengths for multi-stage contacting of the undersides of the printed circuit boards, said lower pressure rams adjustable in multi-stages in a vertical direction, and wherein said upper needle adapter carries at least third and fourth resilient, upper contact needles arranged test-specimen-associated, said third and fourth contact needles having different lengths for multi-stage contacting of the upper sides of the printed circuit boards.

19. The testing device according to claim 18, wherein said lower pressure rams are guided in said lower needle adapter and are actuatable via a lower, shared pressure plate.

20. The testing device according to claim 18, wherein said testing device further comprises at least two centering pins leading in comparison to the upper pressure rams and arranged in the upper needle adapter for positioning the printed circuit boards.

* * * * *